(12) United States Patent
Hallin et al.

(10) Patent No.: US 7,173,285 B2
(45) Date of Patent: Feb. 6, 2007

(54) LITHOGRAPHIC METHODS TO REDUCE STACKING FAULT NUCLEATION SITES

(75) Inventors: Christer Hallin, Linkjping (SE); Heinz Lendenmann, Stocksund (SE)

(73) Assignee: Cree, Inc., Durham, NC (US)

( * ) Notice: Subject to any disclaimer, the term of this patent is extended or adjusted under 35 U.S.C. 154(b) by 141 days.

(21) Appl. No.: 10/929,226

(22) Filed: Aug. 30, 2004

(65) Prior Publication Data
US 2005/0205871 A1  Sep. 22, 2005

Related U.S. Application Data

(60) Provisional application No. 60/554,123, filed on Mar. 18, 2004.

(51) Int. Cl.
*H01L 29/15* (2006.01)
(52) U.S. Cl. .......................... 257/77; 257/76; 257/628; 438/931; 438/105
(58) Field of Classification Search .................. 257/77; 438/931
See application file for complete search history.

(56) References Cited

U.S. PATENT DOCUMENTS

| | | |
|---|---|---|
| 4,865,685 A | 9/1989 | Palmour |
| 4,912,063 A | 3/1990 | Davis et al. |
| 4,912,064 A | 3/1990 | Kong et al. |
| 4,981,551 A | 1/1991 | Palmour |
| 5,227,034 A | 7/1993 | Stein et al. |
| 5,571,374 A | 11/1996 | Thero et al. |
| 5,679,153 A | 10/1997 | Dmitriev et al. |
| 6,034,001 A | 3/2000 | Shor et al. |
| 6,297,522 B1 | 10/2001 | Kordina et al. |
| 6,452,228 B1 | 9/2002 | Okuno et al. |
| 6,569,250 B2 | 5/2003 | Paisley et al. |
| 6,649,497 B2 * | 11/2003 | Ring ........................ 438/571 |
| 6,853,006 B2 | 2/2005 | Kataoka et al. |
| 7,018,554 B2 * | 3/2006 | Sumakeris .................. 216/67 |
| 2003/0042538 A1 | 3/2003 | Kumar et al. |
| 2003/0079689 A1 | 5/2003 | Sumakeris et al. |
| 2003/0080842 A1 | 5/2003 | Sumakeris et al. |

(Continued)

FOREIGN PATENT DOCUMENTS

DE  103 34 819 A1  2/2004

OTHER PUBLICATIONS

"Notification of Transmittal of The International Search Report and the Written Opinion of the International Searching Authority, or the Declaration", "Written Opinion of the International Searching Authority" and "International Search Report", PCT/US2005/004480, Oct. 7, 2005.

(Continued)

*Primary Examiner*—Carl Whitehead, Jr.
*Assistant Examiner*—Colleen E. Rodgers
(74) *Attorney, Agent, or Firm*—Myers Bigel Sibley & Sajovec, P.A.

(57) ABSTRACT

Epitaxial silicon carbide layers are fabricated by forming features in a surface of a silicon carbide substrate having an off-axis orientation toward a crystallographic direction. The features include at least one sidewall that is orientated nonparallel (i.e., oblique or perpendicular) to the crystallographic direction. The epitaxial silicon carbide layer is then grown on the surface of the silicon carbide substrate that includes features therein.

16 Claims, 7 Drawing Sheets

U.S. PATENT DOCUMENTS

2003/0188687 A1 10/2003 Paisley et al.
2004/0183079 A1 9/2004 Kaneko et al.

OTHER PUBLICATIONS

Sumakeris et al., *Methods and Apparatus for Controlling Formation of Deposits in a Deposition System and Deposition Systems and Methods Including the Same*, U.S. Appl. No. 10/414,787, filed Apr. 16, 2003.

Sumakeris, *Method to Reduce Stacking Fault Nucleation Sites and Reduce Forward Voltage Drift in Bipolar Devices*, U.S. Appl. No. 10/605,312, filed Sep. 22, 2003.

"Notification of Transmittal of The International Search Report and the Written Opinion of the International Searching Authority, or the Declaration", "Written Opinion of the International Searching Authority" and "International Search Report", PCT/US2005/004473, May 10, 2005.

Nikolaev et al., "SiC liquid-phase epitaxy on patterned substrates", *Journal of Crystal Growth*, 166:607-611 (1996).

Nordell et al., "Equilibrium crystal shapes for 6H AND 4H SiC grown on non-planar substrates", *Materials Science and Engineering*, B61-62:130-134 (1999).

Nordell et al., "Homoepitaxy of 6H and 4H SiC on nonplanar substrates", *Appl. Phys. Lett.*, 72(2):197-199 (1998).

Richter et al., "Rapid plasma etching of cubit SiC using $NF_3/O_2$ gas mixtures", *Materials Science and Engineering*, B46:160-163 (1997).

\* cited by examiner

LITHOGRAPHIC METHODS TO REDUCE STACKING FAULT NUCLEATION SITES

CROSS-REFERENCE TO PROVISIONAL APPLICATION

This application claims the benefit of and priority from Provisional Application Ser. No. 60/554,123, filed Mar. 18, 2004, entitled Lithographic Method to Reduce Stacking Fault Nucleation Sites and Reduce $V_f$ Drift in Bipolar Devices and Structures Having Reduced Stacking Fault Nucleation Sites, the disclosure of which is hereby incorporated herein by reference in its entirety as if set forth fully herein.

FIELD OF THE INVENTION

This invention relates to semiconductor materials and devices and fabrication methods therefor, and more particularly to methods of growing monocrystalline semiconductor materials, materials formed thereby and devices formed therein.

BACKGROUND

The present invention relates to methods of fabricating semiconductor materials used in electronic devices, such as power electronic devices. In particular, some embodiments of the invention relate to processes that can reduce crystal defects in silicon carbide, and the resulting structures and devices. The present invention is related to the subject matter disclosed and claimed in co-pending and commonly assigned application Ser. No. 10/046,346; filed Oct. 26, 2001 and now published as No. 2003-0080842 A1 as well as co-pending and commonly assigned application Ser. No. 10/605,312 filed Sep. 22, 2003; the contents of both of which are incorporated entirely herein by reference in their entirety, as set forth fully herein.

Silicon Carbide

Silicon carbide (SiC) has emerged over the last two decades as an appropriate candidate semiconductor material that can offer a number of advantages over both silicon and gallium arsenide. In particular, silicon carbide has a wide bandgap, a high breakdown electric field, a high thermal conductivity, a high saturated electron drift velocity, and is physically extremely robust. Silicon carbide has an extremely high melting point and is one of the hardest known materials in the world.

Because of its physical properties, however, silicon carbide also may be relatively difficult to produce. Because silicon carbide can grow in many polytypes, it may be difficult to grow into large single crystals. The high temperatures used to grow silicon carbide also may make control of impurity levels (including doping) relatively difficult, and likewise may raise difficulties in the production of thin films (e.g. epitaxial layers). Because of its hardness, the traditional steps of slicing and polishing semiconductor wafers also may be more difficult with silicon carbide. Similarly, its resistance to chemical attack may make it difficult to etch in a conventional fashion.

In addition, silicon carbide can form over 150 polytypes, many of which are separated by relatively small thermodynamic differences. As a result, growing single crystal substrates and high quality epitaxial layers ("epilayers") in silicon carbide has been, and may remain, a difficult task.

Nevertheless, based on a great deal of research and discovery in this particular field, including that carried out by the assignee of the present invention, a number of advances have been made in the growth of silicon carbide and its fabrication into useful devices. Accordingly, commercial devices are now available that incorporate silicon carbide as a substrate for other useful semiconductors such as the Group III nitrides, to produce blue and green light emitting diodes. Also, commercial silicon carbide-based devices are available for microwave and radio frequency (RF) high-power, high-voltage applications, and/or for other applications.

As the success of silicon-carbide technology has increased the availability of certain SiC-based devices, particular aspects of those devices have become more apparent. In particular, it has been observed that the forward voltage ($V_f$) of some silicon carbide-based bipolar devices such as bipolar power devices may increase noticeably during operation of some devices. This increase is generally referred to as "$V_f$ drift." For a number of reasons, such functional problems in semiconductor devices can often result from defects in the crystal structure of the material from which the devices are formed. Examples of these defects are discussed below.

Deposition systems and methods are commonly used to form layers of semiconductor materials, such as thin epitaxial films, on substrates. For example, a chemical vapor deposition (CVD) reactor system and process may be used to form a layer of semiconductor material such as silicon carbide (SiC) on a substrate. CVD processes may be particularly effective for forming layers with controlled properties, thicknesses, and/or arrangements such as epitaxial layers. Typically, in a deposition system, such as a CVD system, the substrate is placed in a reaction chamber within a susceptor and one or more process gases including reagents or reactants to be deposited on the substrate are introduced into the chamber adjacent the substrate. The process gases may be flowed through the reaction chamber in order to provide a uniform or controlled concentration of the reagents or reactants to the substrate.

Silicon Carbide Crystal Structure

A deposition system, such as a CVD reactor, may be used to form epitaxial layers of silicon carbide on a single crystal silicon carbide substrate having a predetermined polytype such as 2H, 4H, 6H, 15R, 3C and the like. The term "polytype" refers to the ordering and arrangement of layers of atoms within a crystal structure. Thus, although the different polytypes of silicon carbide are stoichiometrically identical, they possess different crystal structures and consequently may have different material properties such as bandgap, carrier mobility and breakdown field strength. The letters H, R and C refer to the general crystal structure of the polytype, namely, hexagonal, rhombohedral and cubic, respectively. The numbers in the polytype designations refer to the repetition period of layer arrangements. Thus, a 4H crystal has a hexagonal crystal structure in which the arrangement of atoms in a crystal repeats every four bi-layers.

FIG. 1 illustrates a hexagonal unit cell of a hypothetical crystal. The unit cell 60 includes a pair of opposing hexagonal faces 61A, 61B. The hexagonal faces are normal to the c-axis, which runs along the <0001> direction as defined by the Miller-Bravais indexing system for designating directions in a hexagonal crystal. Accordingly the hexagonal faces are sometimes called the c-faces, which define the c-planes or basal planes of the crystal. Planes perpendicular to the c-plane are referred to as prismatic planes.

Silicon carbide possesses a number of potentially advantageous physical and electronic characteristics for semiconductor performance and devices. These may include a wide bandgap, high thermal conductivity, high saturated electron drift velocity, high electron mobility, superior mechanical strength, and radiation hardness. However, the presence of crystalline defects in silicon carbide films may limit the performance of electronic devices fabricated in the films, depending on the type, location, and density of the defects. Accordingly, significant research has focused on reducing defects in silicon carbide films. Certain defects, such as micropipes, are known to severely limit and even prevent device performance. Other defects, such as threading dislocations, are not considered to be individually catastrophic to device operation, and therefore they may not significantly impact device performance at densities normally found in epitaxial films.

For applications where a high voltage blocking capability is desired (for example power switching applications), silicon carbide films are usually grown "off-axis." That is, the substrate crystal is sliced at an angle that is slightly oblique to the normal crystal axis (the c-axis). Taking for example a hexagonal polytype such as 4H or 6H, the oblique angle of the cut may be made in one of the standard crystallographic directions illustrated in FIG. 2, namely the <11$\bar{2}$0> direction (towards a point of the hexagonal unit cell) or the <10$\bar{1}$0> direction (towards the center of a flat side of the hexagonal unit cell), or along a different direction. As a result of the off-axis slicing, the face of a prepared substrate may be characterized by a periodic arrangement of plateaus and steps. See, for example, U.S. Pat. No. 4,912,064 to Kong et al, entitled Homoepitaxial Growth of Alpha-SiC Thin Films and Semiconductor Devices Fabricated Thereon, assigned to North Carolina State University, the disclosure of which is hereby incorporated herein by reference in its entirety as if set forth fully herein.

Thus when an epitaxial layer is grown on the substrate, the deposited atoms bond to atoms at the exposed edges of the crystal layer steps, which causes the steps to grow laterally in so-called step-flow fashion. Step-flow growth is illustrated in FIG. 3. Each layer or step grows in the direction in which the crystal was originally cut off-axis (the <11$\bar{2}$0> direction in the case illustrated in FIG. 3).

Crystallographic Defects

At the most basic level, structural crystallographic defects may fall into four categories: point defects, line defects, planar defects and three dimensional defects. Point defects include vacancies, line defects include dislocations, planar defects include stacking faults and three-dimensional defects include polytype inclusions.

A dislocation is a kind of structural imperfection that extends for many unit cell lengths throughout a crystal. A more definite description of dislocation may classify them as screw and edge dislocations. As recognized by those persons skilled in this art, a symmetrical path followed from atom to atom (or from ion to ion) in a real crystal that returns upon itself, is referred to as a Burgers circuit. If the same path in the lattice that typifies the structure does not return upon itself, so that the beginning and end do not lie on the same atom, then the Burgers circuit encloses one or more dislocations. The vector that completes the closed circuit in the lattice is referred to as the Burgers vector and measures the magnitude and direction of the dislocation.

If the Burgers vector is parallel to the line that locates the dislocation, the defect is referred to as a screw dislocation. Alternatively, if the Burgers vector is perpendicular to the dislocation, it is referred to as an edge dislocation. The simplest version of an edge dislocation is an incomplete plane of atoms or ions interleaved between two normal planes in a manner somewhat analogous to an extra card inserted halfway into a deck.

Screw dislocations are not necessarily disadvantageous and, in fact, can be advantageous for the growth of a crystal. For example, a 1C threading screw dislocation at the nominally (0001) oriented growth surface of a silicon carbide crystal presents a regenerating edge that is one or a few atoms high. At this edge, continued growth of the crystal is relatively easy. Dislocations, however, allow plastic flow to occur in a crystal relatively easily. Dislocations may move preferentially along slip planes. The dislocation moves relatively easily through the crystal because motion in the slipped plane involves only a slight displacement of the structural elements. Stated differently, the slipped planes provide a low-energy intermediate state by which a crystal can be reorganized.

Defects in Silicon Carbide

In silicon carbide power devices, the availability of such a relatively low-energy intermediate state may encourage faults to continue to grow, since the operation of the device can provide the relatively small amount of energy that may be required to drive dislocation motion.

Commercial quality SiC wafers and epilayers typically include both screw and edge dislocations. These dislocations can be further grouped by their alignment within the crystal. Those dislocations that propagate along the c-axis are called threading dislocations, while dislocations that lie within the c-plane are termed basal plane dislocations. In general, in SiC, it is energetically favorable that basal plane dislocations may preferentially decompose into partial dislocations via the mechanism described below:

$$1/3<11\bar{2}0> \rightarrow 1/3<10\bar{1}0> + 1/3<01\bar{1}0> \qquad \text{Equation 1}$$

The above decomposition reaction describes the decomposition of a basal plane dislocation into two Shockley partial dislocations. The line defects generated during the above decomposition will bound a stacking fault defect. In fact, partial dislocations will generally bind the entire perimeter of the stacking fault unless the stacking fault reaches a free surface. This stacking fault will generally be electrically active in bipolar devices, and, during forward operation, the density of the electron-hole plasma may be reduced in the vicinity of the stacking fault. The reduced plasma density may increase the forward voltage of the device. A further potential complication is that through recombination enhanced dislocation glide, the stacking fault may continue to expand during forward operation of the device. This behavior can raise a substantial barrier to device exploitation because it can result in devices with functional properties that can change unpredictably during operation.

Stated differently, the application of electric current through a silicon carbide bipolar device may tend to initiate or propagate (or both) changes in the crystal structure due to preexisting defects in the crystal. As noted above, many SiC polytypes are in close thermodynamic proximity, and solid phase transformations are quite possible. When the stacking faults impact a significant portion of the active area of a device, they tend to cause the forward voltage to increase in an undesirable manner that can prevent the device from operating as precisely and/or efficiently as required or desired in many applications.

In some conventions, dislocation density is described by centimeters of dislocation length per cubic centimeter of material, and thus report dislocation density units of per square centimeter ($cm^{-2}$). In another convention (and as used herein) the off-axis orientation of 4H—SiC substrates for SiC epilayer growth and the common etch technique used to detect dislocations make it more convenient to use etch pit density (also in the units of $cm^{-2}$), to describe dislocation densities in SiC. Those of skill in this art will thus recognize that for a given dislocation density expressed as $cm/cm^3$, one could get a very different dislocation pit density when expressed as $pits/cm^2$ depending on the typical dislocation configuration and the off-axis angle of the substrate. Therefore, although the two numbers will have the same net units ($cm^{-2}$), they do not necessarily indicate the same actual dislocation density. For the sake of clarity and consistency, in the present application, dislocation density will be described as the density of specific pits delineated on an etched epi-surface of a silicon face prepared, 8° off-axis (0001) oriented substrate.

Present commercially available 4H—SiC substrates may have approximately 1E3 to 1E5 (about $10^{3-105}$) dislocations per $cm^2$ by the convention used herein. This includes threading screw and edge dislocations and basal plane dislocations. Presumably, all types of dislocations can impact device performance, but the basal plane dislocation has been particularly implicated as the prevalent nucleation site of the stacking faults that may cause $V_f$ drift.

In turn, defects in the substrate are often replicated in epitaxial layers grown on such substrates, thus making substrate crystal quality a profoundly important factor with respect to the quality and performance of resulting devices.

Conventional substrate preparation and epilayer growth practices can fairly effectively reduce the density of basal plane dislocations from 1E3–1E4 $cm^{-2}$ in the substrate to about 400 $cm^{-2}$ in the epilayer. This reduction in dislocation density may be accomplished via changes in both the substrate preparation and the epilayer growth operations.

Accordingly, for continued improvement in the structure and operation of SiC-based bipolar and other devices it may be desirable to provide continued improvement in the underlying substrates and their crystal structures.

SUMMARY OF THE INVENTION

Epitaxial silicon carbide layers may be fabricated, according to some embodiments of the present invention, by forming a plurality of features in a surface of a silicon carbide substrate having an off-axis orientation toward a predetermined crystallographic direction. The plurality of features includes at least one sidewall that is orientated nonparallel (i.e., oblique or perpendicular) to the predetermined crystallographic direction. The epitaxial silicon carbide layer is then grown on the surface of the silicon carbide substrate that includes the plurality of features therein. In some embodiments, features are formed by masking the surface of the silicon carbide substrate having an off-axis orientation toward a predetermined crystallographic direction and then etching the surface of the silicon carbide substrate that is exposed. In some embodiments, etching may be performed by dry etching. Dry etching may be performed using an etchant gas etch such as $NF_3$ and/or $SF_6$. In some embodiments, $NF_3$ is used. In some embodiments the predetermined crystallographic direction is the <11$\bar{2}$0> direction.

In some embodiments, the plurality of features includes a plurality of trenches extending in a direction perpendicular to the predetermined crystallographic direction. In other embodiments, the trenches extend oblique to the predetermined crystallographic direction. Oblique and perpendicular trenches also may be provided. In other embodiments, the plurality of features includes a plurality of pits such as a periodically repeating pattern of hexagonal pits.

A silicon carbide semiconductor structure according to some embodiments of the present invention includes a silicon carbide substrate having an off-axis orientation toward a predetermined crystallographic direction and including a plurality of features in the surface thereof. The plurality of features includes at least one sidewall that is oriented nonparallel (i.e., oblique and/or perpendicular) to the predetermined crystallographic direction. An epitaxial silicon carbide layer is also provided on the surface of the silicon carbide substrate that includes the plurality of features therein. The predetermined crystallographic direction may be the <11$\bar{2}$0> direction. The features may include trenches and/or depressions as was described above.

Other embodiments of the present invention fabricate an epitaxial silicon carbide layer by epitaxially growing from at least one sidewall of a plurality of features in a surface of the silicon carbide substrate having an off-axis orientation toward a predetermined crystallographic direction to form the epitaxial silicon carbide layer, the at least one sidewall being oriented nonparallel to the predetermined crystallographic direction. The features may be trenches and/or depressions as was described above.

Moreover, methods and structures according to other embodiments of the present invention may use monocrystalline substrates other than silicon carbide to fabricate one or more epitaxial layers thereon.

DETAILED DESCRIPTION OF EMBODIMENTS OF THE INVENTION

Figure 1:
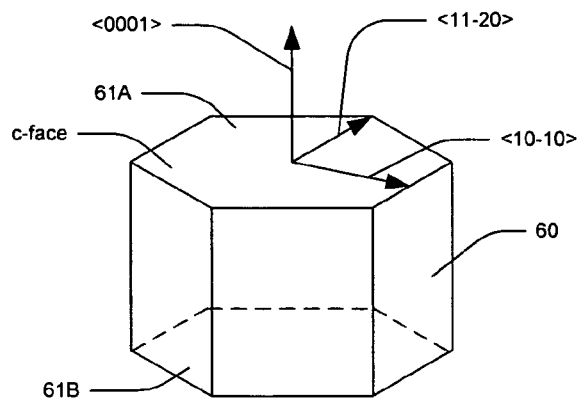
FIG. 1 is a schematic diagram of a hexagonal crystal unit cell structure.
Figure 2:
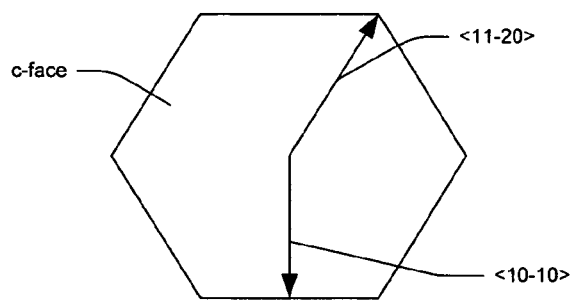
FIG. 2 is a top view of a hexagonal unit cell illustrating standard crystallographic directions.
Figure 3:
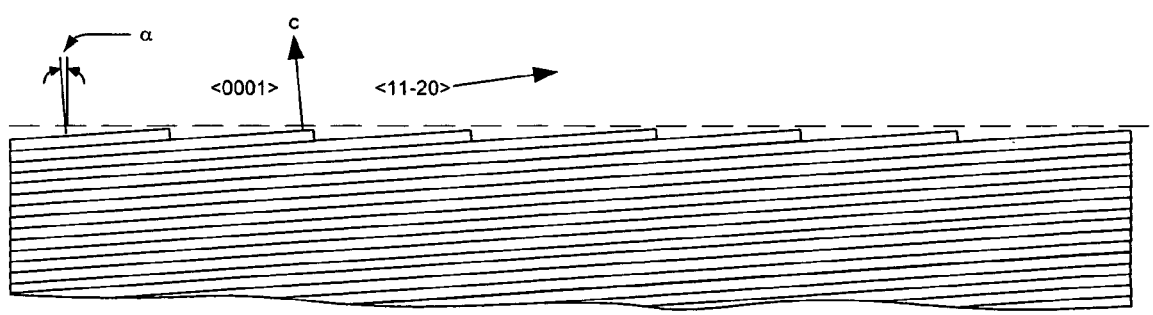
FIG. 3 is a schematic side view of an off-axis silicon carbide crystal.

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. It will be understood that when an element or layer is referred to as being "on" another element or layer, it can be directly on the other element or layer or intervening elements or layers may be present. In contrast, when an element is referred to as being "directly on" another element or layer, there are no intervening elements or layers present. Like numbers refer to like elements throughout. As used herein, the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. Thus, for example, three or more epitaxial layers may be grown according to embodiments of the invention even though growth of two layers is described herein.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in the Figures is turned over, elements described as being on the "lower" side of other elements would then be oriented on "upper" sides of the other elements. The exemplary term "lower", can therefore, encompass both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Embodiments of the present invention are described herein with reference to cross-sectional and/or other views that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a grown or deposited region illustrated as a polygon will, typically, have rounded or curved features and/or a gradient of concentrations at its edges with another region rather than a discrete change from a first region to a second region of different composition. Thus, the regions illustrated in the figures are schematic in nature and their shapes are not intended to illustrate the precise shape of a region of a device and are not intended to limit the scope of the present invention.

According to some embodiment of the invention, methods of fabricating an epitaxial silicon carbide layer on a silicon carbide substrate having an off-axis orientation toward a first crystallographic direction can include masking the first surface of the substrate with a patterned etch mask, etching the first surface of the substrate to form a plurality of features, each of which includes a sidewall oriented at an angle that is oblique or perpendicular to the first crystallographic direction, and growing an epitaxial layer of silicon carbide on the etched first surface. The substrate has an off-axis orientation towards a first crystallographic direction, such as the <11$\overline{2}$0> direction. The partially masked substrate may be etched using a dry etch process such as reactive ion etching using $NF_3$ and/or $SF_6$.

In some embodiments, the plurality of features includes a plurality of trenches extending in a direction that is oblique and/or perpendicular to the first crystallographic direction. In other embodiments, the plurality of features includes a periodically repeating pattern of hexagonal depressions.

In some embodiments, a substrate is patterned with a plurality of features including sidewalls and a first epitaxial layer is grown with a first defect density. The first epitaxial layer is then patterned with a plurality of features having sidewalls and a second epitaxial layer is grown with a second defect density less than the first defect density.

Semiconductor structures according to some embodiments of the invention can include an off-axis silicon carbide substrate having a first surface and an epitaxial layer of silicon carbide formed on the first surface. The first surface of the substrate includes a plurality of features, each of which has a sidewall that is perpendicular or oblique to the off-axis crystallographic direction. The epitaxial layer has a reduced density of basal plane dislocations compared to the substrate.

Other embodiments of the invention include an off-axis silicon carbide substrate having a first surface and a first epitaxial layer of silicon carbide formed on the first surface. The surface of the substrate includes a plurality of features, each of which has a sidewall that is perpendicular or oblique to the off-axis crystallographic direction. The first epitaxial layer has a reduced density of basal plane dislocations compared to the substrate. The first epitaxial layer further includes a plurality of features, each of which has a sidewall that is perpendicular or oblique to the off-axis crystallographic direction. A second epitaxial layer is grown on the first epitaxial layer. The second epitaxial layer has a reduced density of basal plane dislocations compared to the first epitaxial layer.

Some embodiments of the invention can provide methods of reducing stacking fault nucleation site density and/or reducing forward voltage ($V_f$) drift in silicon carbide-based bipolar devices, and silicon carbide structures having a reduced density of basal plane dislocations that can serve as stacking fault nucleation sites.

Some embodiments include conducting an etch, such as a dry etch, and in some embodiments a reactive ion etch (RIE) using $NF_3$ and/or $SF_6$ chemistry, on a masked surface of a silicon carbide substrate to form a plurality of structures having sidewalls from which epitaxial growth can proceed. Exemplary, but not limiting, techniques for dry etching of silicon carbide are set forth in U.S. Pat. Nos. 4,865,685 and 4,981,551, the contents of which are incorporated entirely herein by reference. Other techniques and chemistries for carrying out the etches described herein are generally well-recognized in the art and will not be described in detail herein other than to illustrate embodiments of the invention.

The term "substrate" is used herein in a sense that is broad enough to include both a bulk single crystal (usually cut from a boule) as well as a device precursor structure, such as a wafer, that can include one or more epitaxial layers, but which fundamentally (although not necessarily exclusively) serves as the physical and electronic support for a device formed thereon.

Similarly, the terms "dry etch" and "wet etch," are often used to refer to reactive ion or plasma etches ("dry") or to etches in molten salts or other solutions ("wet").

Generally—but not necessarily—the substrate will be n-type, because n-type substrates may offer a number of advantages in silicon carbide-based devices, and may have an activated carrier concentration of about 1E18–1E19 ($1 \times 10^{18} – 1 \times 10^{19}$) carriers per $cm^3$. In comparison to the substrate, the carrier concentration of the epitaxial layer may be selected (or described) in terms of its purpose. "Conductive" layers may typically have a carrier concentration of 1E18–19 $cm^{-3}$. "Blocking" layers may typically have carrier concentrations less than 1E16 $cm^{-3}$. "Active" layers may have carrier concentrations within these parameters, depending on the structure or purpose of the end device. Accordingly, although terms such as n, n+ and n− can be used to describe both substrates and epilayers, such terminology should be considered in an illustrative rather than a limiting sense.

The silicon carbide substrate upon which the device is formed can be taken from a larger crystal (or "boule"), typically by the steps of sawing a silicon carbide substrate wafer from a silicon carbide boule, and thereafter conducting a nonselective etch on the substrate wafer. In most circumstances, the sawed substrate wafer is lapped, polished, etched (typically RIE), and cleaned (with an acid or solvent) prior to conducting a first patterned etch according to some embodiments of the invention. The term "lapped" is used in its typical sense; i.e., to describe the steps of flattening the wafer surfaces using a counter-rotating lapping machine and an abrasive (e.g. diamond) slurry. Lapping can help make the wafer surfaces parallel and can reduce mechanical defects such as saw markings. Similarly, the polishing, etching and cleaning steps may be otherwise carried out conventionally prior to steps of the present invention.

Some embodiments of the invention can advantageously reduce the density of basal plane dislocations in the epilayer. This reduction in basal plane dislocation density may be combined with the measures identified to isolate active device regions from the substrate and surface defects discussed in previously-incorporated application Ser. No. 10/046,346, and may be used to provide SiC bipolar devices.

Figure 4:
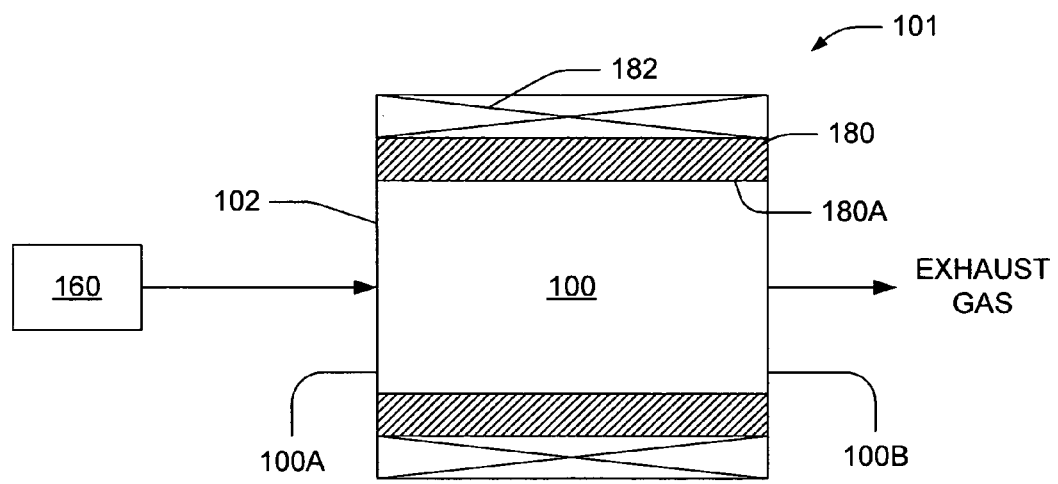
FIG. 4 is a schematic view of an epitaxial deposition system.
Figure 5:
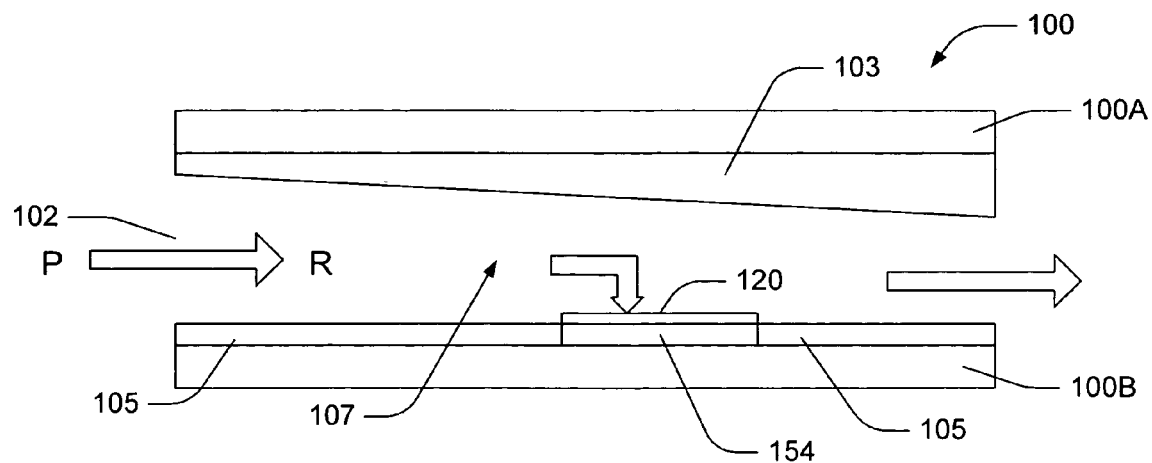
FIG. 5 is a cross section of a susceptor assembly that can form a part of the deposition system of FIG. 4.

A deposition system 101 in which some embodiments of the present invention may be practiced is schematically shown in plan view in FIG. 4. The deposition system 101 may be a horizontal, hot wall, flow through, CVD system as shown including a susceptor assembly 100, a quartz tube 180 defining a through passage 180A, an electromagnetic frequency (EMF) generator 182 (for example, including a power supply and an RF coil surrounding the tube 180) and a process gas supply 160. An insulative cover may be provided about the susceptor assembly 100 in addition to or in place of the quartz tube 180. The deposition system 101 may be used to form a layer or film on a substrate 120 (FIG. 5). While only a single substrate 120 is illustrated in FIG. 5, the system 101 may be adapted to form films concurrently on multiple substrates 120.

The substrate 120 may be a wafer or other structure formed of the same or a different material than that of the layer to be deposited. The substrate 120 may be formed of, for example, 2H—, 4H—or 6H—SiC. The substrate surface upon which the film is deposited may be a base substrate or a first or subsequent layer superimposed on a base substrate. For example, the surface of the substrate 120 for receiving the deposited film may be a layer previously deposited using the deposition system 101 or an alternative apparatus. As will be appreciated by those of skill in the art in light of the present disclosure, embodiments of the present invention may be advantageously utilized with semiconductor materials other than those specifically mentioned herein.

Generally, the process gas supply 160 supplies a process gas into and through the susceptor assembly 100 as discussed below. The EMF generator 182 inductively heats the susceptor assembly 100 to provide a hot zone in the susceptor assembly 100 where deposition reactions take place. The process gas continues through and out of the susceptor assembly 100 as an exhaust gas that may include remaining components of the process gas as well as reaction by-products, for example. Embodiments of the present invention may use types of deposition systems other than hot wall CVD systems. Other modifications to the systems and methods of the present invention will be apparent to those of ordinary skill in the art upon reading the description herein.

The process gas may include one or more components such as reagents, reactants, species, carriers and the like. Where it is desired to form a SiC layer on a substrate, the process gas may include precursor gases such as silane ($SiH_4$) and propane ($C_3H_8$) along with a carrier gas such as purified hydrogen gas ($H_2$). The process gas supply 160 may be provided from one or more pressurized containers of the gases with flow control and/or metering devices as needed.

An exemplary conventional susceptor 100 is shown in FIG. 5. The susceptor 100 may be used, for example, in a flow through, hot wall, and/or CVD reactor, such as was illustrated in FIG. 4. The susceptor 100 has a top susceptor member 100A and a bottom susceptor member 100B. The susceptor 100 also has a top liner 103 and a bottom liner 105 defining a reaction chamber 107 therebetween. A substrate 120, such as a semiconductor wafer, is positioned in the reaction chamber 107 and may be situated on an interior surface of a platter 154 (which may rotate), for example. A process gas P is introduced to the reaction chamber 107 at one end, flowed through the reaction chamber 107 past the substrate 120, and finally exhausted from the reaction chamber 107 at the opposite end. As used herein, the term process gas refers to one or more gases. As indicated by the arrows in the reaction chamber 107 as shown in FIG. 5, as the process gas flows through the reaction chamber 107 a portion of the process gas may contact the substrate 120 as intended and thereby deposit the reagents or reactants on the substrate 120 to form a layer thereon. In some systems, the reaction chamber 107 may have a length of between about 0.1 and 1 meter, a width of between about 0.05 and 0.5 meter, and a height of between about 1 and 10 cm. The reaction chamber 107 is not limited to these dimensions, however. The susceptor members may include high quality graphite. Examples of CVD deposition systems including susceptor designs are found in U.S. Pat. Publication No. US 2003/0079689 entitled Induction Heating Devices and Methods for Controllably Heating an Article and U.S. patent application Ser. No. 10/414,787, filed Apr. 16, 2003 entitled Methods and Apparatus for Controlling Formation of Deposits in a Deposition System and Depositions Systems and Methods Including the Same both of which are incorporated herein by reference in their entireties.

In certain embodiments, the susceptor members 100A, 100B are formed of a material suitable to generate heat responsive to eddy currents generated therein by the EMF generator 182, such materials and inductive heating arrangements being well known to those of skill in the art. The members may be formed of graphite, and more preferably of high purity graphite.

A platter 154 or the like may be situated between the bottom member 100B and the substrate 120 to support the substrate 120. According to some embodiments, the platter 154 may be rotatively driven by a suitable mechanism (not shown). For example, the system may include a gas-driven rotation system as described in U.S. application Ser. No. 09/756,548, entitled Gas Driven Rotation Apparatus and Method for Forming Silicon Carbide Layers, filed Jan. 8, 2001, and/or as described in U.S. application Ser. No. 10/117,858, entitled Gas Driven Planetary Rotation Apparatus and Methods for Forming Silicon Carbide Layers, filed Apr. 8, 2002, the disclosures of which are hereby incorporated herein by reference in their entireties. Alternatively, the platter 154 may be stationary. The platter 154 may be adapted to hold one or multiple substrates 120. The platter 154 may be formed of any suitable material such as SiC coated graphite, solid SiC and/or solid SiC alloy. The platter 154 may be omitted such that the substrate rests on the susceptor member 100B, the liner 105, or other suitable support.

In use, the process gas supply 160 supplies a flow of the process gas P to the reaction chamber 107 through the inlet opening 102. The process gas P flows generally in a flow direction R. As shown, some portion of the process gas and the reagents therein contact the substrate 120 to form the desired layer (e.g., an epilayer) on the exposed surface of the substrate 120.

While the foregoing deposition system 101 and methods are described as relating to a horizontal, hot wall, CVD, flow through deposition process, various aspects of the present invention may be used in other types of deposition systems and processes. While particular embodiments have been described with reference to "top", "bottom" and the like, other orientations and configurations may be employed in accordance with the invention. For example, the deposition system and process may be a cold wall and/or non-horizontal flow through system and process. The deposition system and process may be a vapor phase epitaxy (VPE), liquid phase epitaxy (LPE), or plasma enhanced CVD (PECVD) deposition system and process rather than a CVD system or process.

Figure 6:
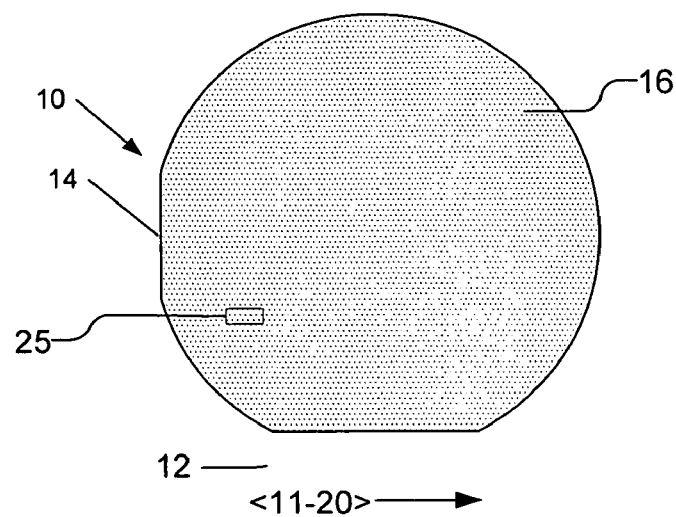
FIG. 6 is a schematic view of a SiC wafer that has been processed in accordance with some embodiments of the invention.

Referring now to FIG. 6, a single crystal silicon carbide substrate wafer 10 on which one or more epitaxial layers is to be grown has a generally circular perimeter. A pair of flats has been milled into the wafer to assist in wafer orientation. In particular, the wafer 10 includes a primary flat 12 and a secondary flat 14. The surface 16 of the wafer corresponds generally to the c-face of the silicon carbide crystal (except that the wafer has been cut at an off-axis angle $\alpha$ towards the $<11\bar{2}0>$ direction. The off-axis angle $\alpha$ may be about 8° in some embodiments. The primary flat 12 runs along the $<11\bar{2}0>$ direction, while the secondary flat 14 is oriented along the $<10\bar{1}0>$ direction.

In some embodiments, prior to epitaxial growth, the surface 16 of the wafer 10 is masked and etched to form a predefined pattern therein. Conventional masks that comprise $SiO_2$, $Si_3N_4$, Indium Tin Oxide (ITO) and/or other conventional masking materials may be used. The masks may be fabricated and patterned using conventional techniques. The etch process may include a reactive ion etch as described above. In other embodiments, maskless etching and/or selective growth techniques may be used to form the plurality of features in the substrate. In yet other embodiments, laser patterning may be used to form the plurality of features in the substrate. The pattern includes a plurality of features, which include at least one sidewall oriented at an oblique or perpendicular angle (i.e., nonparallel) to the crystallographic direction in which step-flow epitaxial growth will occur. In the illustrated embodiment, the wafer 10 is cut off-axis towards the $<11\bar{2}0>$ direction; thus, epitaxial growth will occur in the $<11\bar{2}0>$ direction. Accordingly, in the illustrated embodiment, the wafer includes a plurality of features including at least one sidewall oriented at an oblique or perpendicular angle to the $<11\bar{2}0>$ crystallographic direction.

Figure 7A:
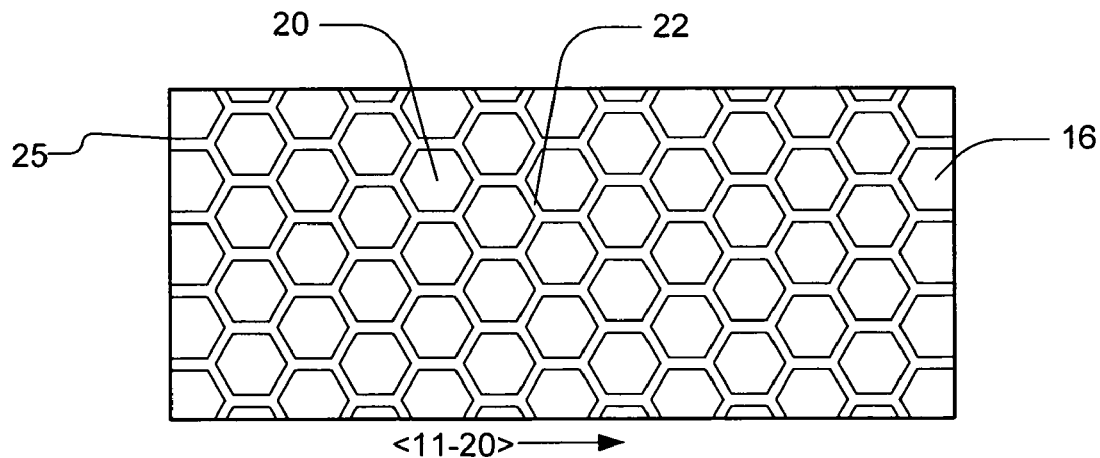
FIGS. 7A and 7B are magnified views of a portion of the surface of a SiC wafer that has been processed in accordance with some embodiments of the invention.

An exemplary etch pattern is illustrated in FIG. 7A, which is an idealized schematic drawing of a magnified view of a portion 25 of the surface of wafer 10 following etching. As illustrated therein, the surface 16 of the wafer 10 includes a plurality of periodically repeating hexagonal pits 20 etched therein. Each pit is surrounded by six sidewalls 22. In some embodiments including the embodiments illustrated in FIG. 7A, at least one pit 20, and in some embodiments each pit 20, is oriented such that two of its sidewalls run approximately parallel to the crystallographic direction in which epitaxial growth will occur (in this case the $<11\bar{2}0>$ direction), while the remaining four sides are oblique to the crystallographic direction in which epitaxial growth will occur. In other embodiments, at least one pit 20 is oriented such that two of its sidewalls run approximately perpendicular to the crystallographic direction in which epitaxial growth will occur, while the remaining four sides are oblique to the crystallographic direction in which epitaxial growth will occur.

Figure 7B:
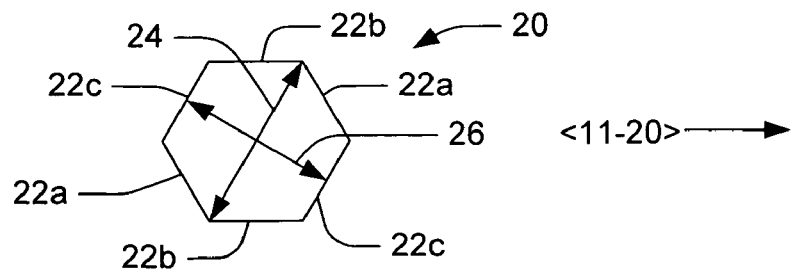

A hexagonal pit 20 is illustrated in detail in FIG. 7B. The pit 20 includes opposing pairs of sidewalls 22a, 22b, and 22c. The pit 20 is further characterized by a major axis 24, which runs through the center of the hexagon between opposing vertices and a minor axis 26, which runs through the center of the hexagon between opposing sides.

In some embodiments, the hexagonal pits 20 may have a depth of about 0.1 to about 1 μm and a major axis of about 5 to about 30 μm. In particular embodiments, the pits 20 may have a depth of about 0.5 μm and a major axis of about 10

μm. In some embodiments, the pits 20 may have a ratio of major axis to depth of about 20:1. The sidewalls 22 may have a width of about 0.25 to 5 μm. In particular embodiments, the sidewalls may have a width of about 4 μm.

Figure 8A:
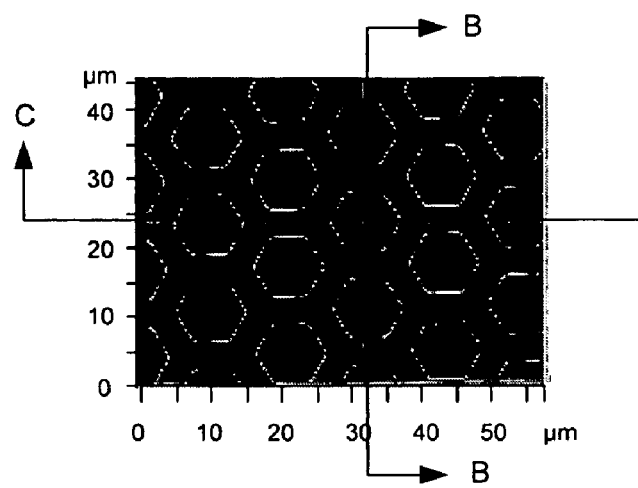
FIG. 8A is an interferometry-derived topographic representation of the surface of a silicon carbide wafer that has been patterned in accordance with some embodiments of the invention with a periodic hexagonal pit structure.
Figure 8B:
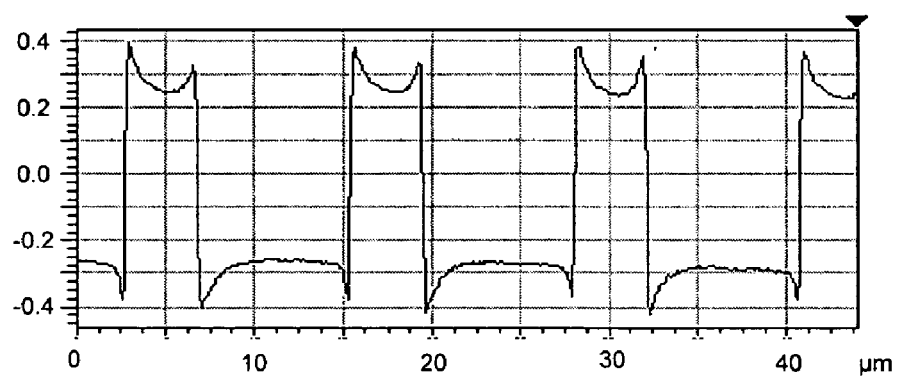
FIG. 8B is a depth profile taken along line B—B of FIG. 8A.
Figure 8C:
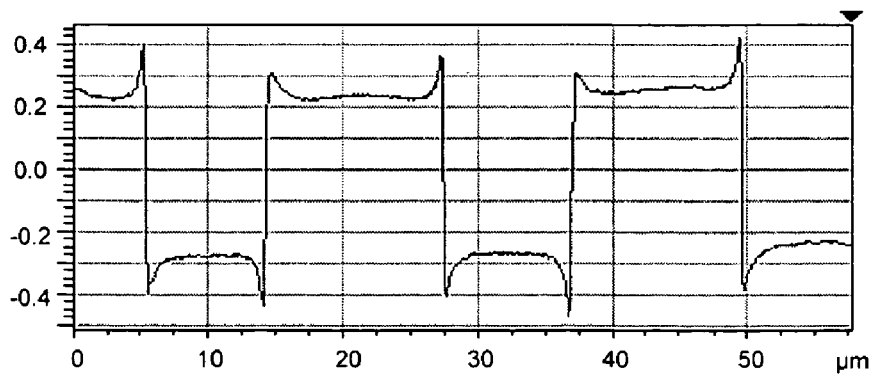
FIG. 8C is a depth profile taken along line C—C of FIG. 8A.

FIGS. 8A–8C illustrate an exemplary structure. FIG. 8A is an interferometry-derived topographic representation of the surface of a silicon carbide wafer that has been patterned in accordance with some embodiments of the invention with a periodic hexagonal pit structure. FIG. 8B is a depth profile taken along line B—B, while FIG. 8C is a depth profile taken along line C—C. The structure illustrated in FIGS. 8A–8C has a major axis of approximately 9.73 μm, a depth of approximately 0.5 μm and a sidewall width of approximately 4 μm.

Other dimensions may be selected without departing from the scope of the invention. For example, the exemplary dimensions given above assume an off-axis angle α of about 8° and were selected based on present understanding and capabilities. If a different off-axis angle is used, other dimensions may be used to increase or maximize the magnitude of defect reduction.

Figure 9A:
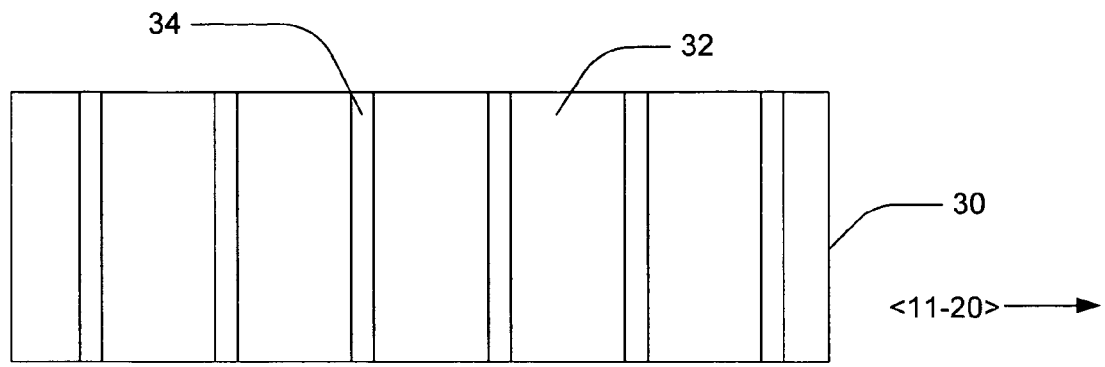
FIG. 9A is a schematic plan view of the surface of a silicon carbide wafer that has been patterned in accordance with some embodiments of the invention with a periodic trench structure.

Other feature shapes besides hexagons may be used in other embodiments of the invention. The features may for example include lines, herringbone patterns, or other polygons. FIG. 9A illustrates a portion of a substrate 30 on which a series of trenches 32 separated by mesa stripes 34 have been formed, for example, by reactive ion etching. The trenches 32 include opposing sidewalls 32A, 32B which run perpendicular to the to the crystallographic direction in which step-flow epitaxial growth will occur, in this case the <11$\bar{2}$0> direction. In some embodiments, the sidewalls are aligned oblique to the crystallographic direction in which step-flow epitaxial growth will occur.

Figure 9B:
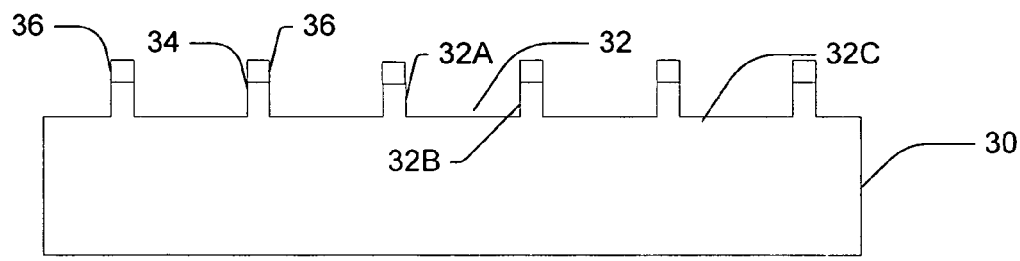
FIG. 9B is a schematic elevation of the structure shown in FIG. 9A.

FIG. 9B is a side view of the substrate 30 showing the trenches 32 and the mesas 34 according to other embodiments. In some embodiments, the trenches 32 may have a width of about 10 to about 40 μm. In particular embodiments, the trenches 32 may have a depth of about 0.5 μm and a width of about 18 μm. In some embodiments, the trenches 32 may have a ratio of width to depth of about 36:1. The mesas 34 may have a width of about 0.25 to 5 μm. In particular embodiments, the mesas 34 may have a width of about 3 μm. A mask 36 is also illustrated in the side view of FIG. 9B.

Figure 9C:
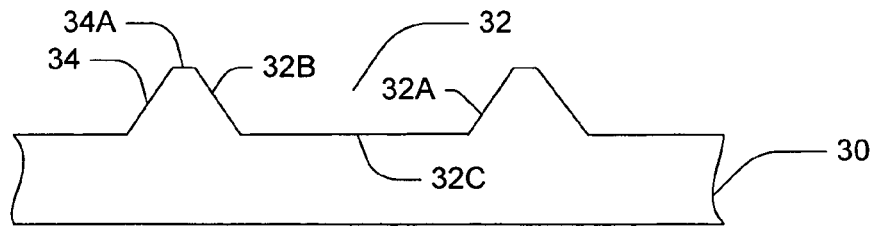
FIG. 9C is a schematic elevation of an alternate embodiment of the structure shown in FIG. 9A.

Sidewalls 32A, 32B may be vertical with respect to the floors 32C of trenches 32 as illustrated in FIG. 9B or they may be angled with respect to floors 32C as illustrated in FIG. 9C. In addition, the sidewalls 32A, 32B may be straight as illustrated or may comprise curved portions. Similarly, with other feature shapes such as hexagons or other polygons, the sidewalls of the feature may be vertical or angled with respect to the substrate and may include straight or curved portions. For example, as shown in FIG. 9C, the structure may be etched such that sidewalls 32A, 32B are angled with respect to the trench floors 32C. In this case, the top portions 34A of the mesas 34 are narrower than their bases. In some embodiments, the mesas may have a width of between about 0 and about 5 μm depending on lithographic and/or other techniques.

After the wafer has been etched to form surface features therein as described above, and the mask is optionally removed, the wafer is placed into an epitaxial growth reactor, such as reactor 100 as described above, and one or more epitaxial layers of silicon carbide are grown on the wafer. As discussed above, epitaxial growth of silicon carbide on an off-axis wafer may proceed in step-flow fashion in the direction of the off-axis cut. Although the precise mechanism is not fully understood, it is presently believed that some basal plane dislocations propagating in the substrate crystal are terminated at the etched sidewalls of the surface features or are converted to a different type of dislocation and are inhibited or discouraged from propagating into the epitaxial layers as basal plane dislocations. Since some basal plane dislocations are prevented from propagating into the epitaxial layers as basal plane dislocations, those dislocations may not be susceptible to decomposing into stacking faults bounded by Shockley partial dislocations, which can form electrically active stacking faults.

Figure 10:
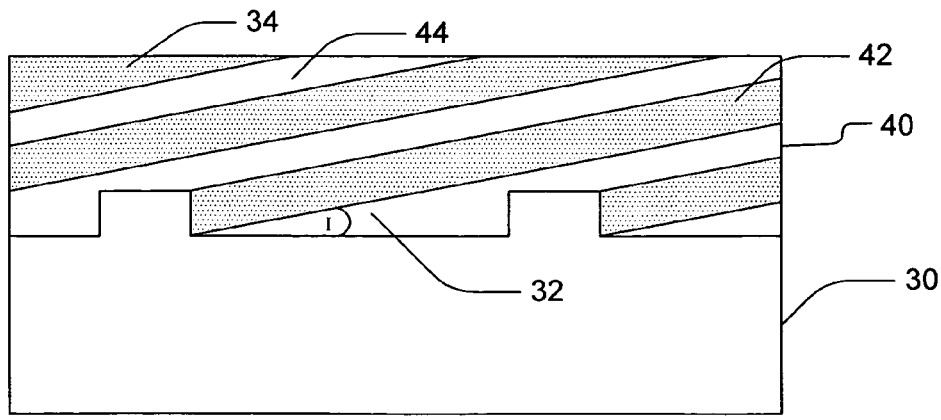
FIG. 10 is a schematic elevation of a structure according to some embodiments of the invention.

Epitaxial growth from a patterned substrate is illustrated in FIG. 10. Substrate 30 includes a plurality of trenches 32 on the surface thereof. An epitaxial layer 40 is grown in step-flow fashion from the surface of the substrate. In accordance with some embodiments of the invention, regions 42 which nucleate and grow from the sidewalls 32A of the trenches 32 can have reduced basal plane defect densities compared with regions 44 which do not nucleate and grow from mesa sidewalls. In particular, regions 42 may exhibit a reduction in basal plane defect density by a factor of 10.

Figure 11:
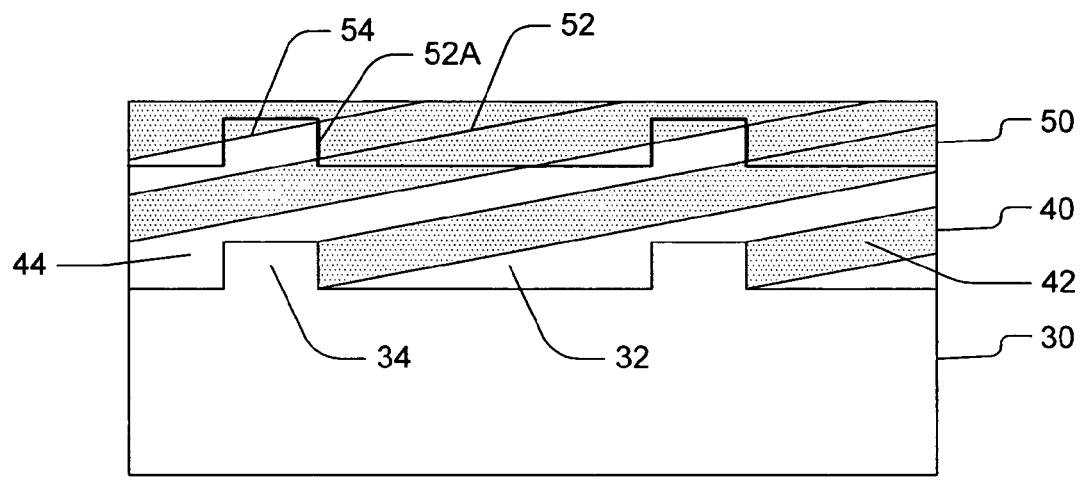
FIG. 11 is a schematic elevation of a structure according to some embodiments of the invention.
Figure 12:
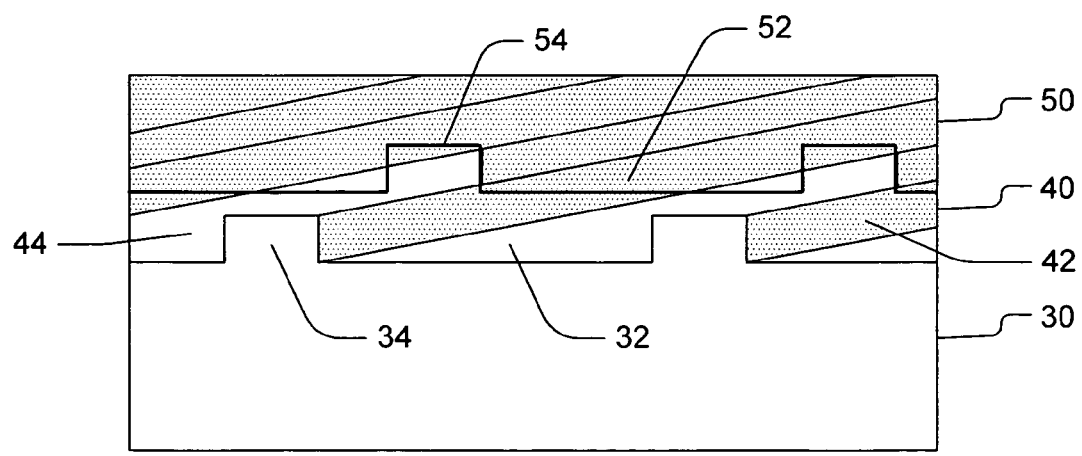
FIG. 12 is a schematic elevation of a structure according to some embodiments of the invention.
Figure 13:
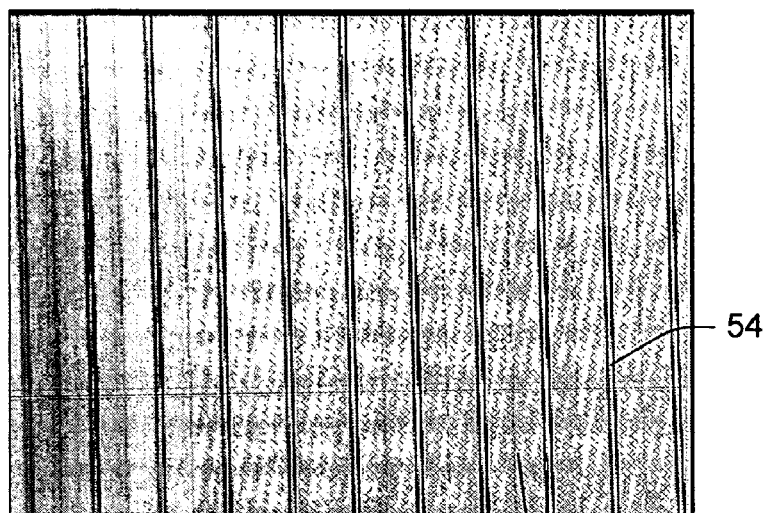
FIG. 13 is a micrograph of the surface of a SiC epitaxial layer according to some embodiments of the invention.

As is shown from FIG. 10, the percentage of the epitaxial layer 40 that may benefit from defect reduction may depend on the geometry of the features. In particular the sidewall height, width and/or spacing may impact the percentage. In order to provide greater reduction in basal plane defect density, it may be desirable to perform a second feature-forming and epitaxial layer growth cycle after growth of an initial epitaxial layer. As illustrated in FIG. 11, substrate 30 includes trenches 32 etched therein. A first epitaxial layer 40 is grown thereon which includes regions 42 having a reduced basal plane defect density which alternate with regions 44 that may not have reduced basal plane defect density. After growth of the first epitaxial layer 40 to a predetermined thickness, the substrate is masked and etched a second time to form trenches 52 which have sidewalls 52A, which in some embodiments span the regions 44. The trenches 52 may have the same dimensions as trenches 42 or at least some of the trenches 52 may have different dimensions than at least some of the trenches 42. Epitaxial layer 50 is then grown thereon. The basal plane dislocation density of layer 50 may be reduced with respect to the basal plane dislocation density of layer 40. In the embodiment illustrated in FIG. 11, the trenches 52 are formed directly above the trenches 32 formed in the substrate 30. As illustrated in FIG. 12, the trenches 52 formed in the epitaxial layer 40 may be offset from the trenches 32 formed in the substrate 30. FIG. 13 is a photograph of a portion of the surface of a silicon carbide wafer that includes mesas 54 that are offset from the underlying mesas 34.

Figure 14:
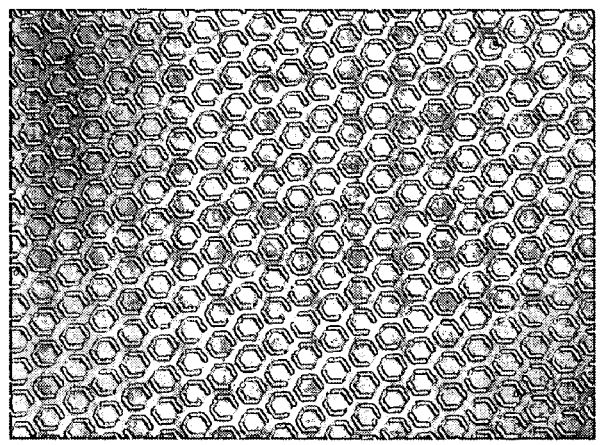
FIG. 14 is a micrograph of the surface of a SiC epitaxial layer according to further embodiments of the invention.
Figure 15:
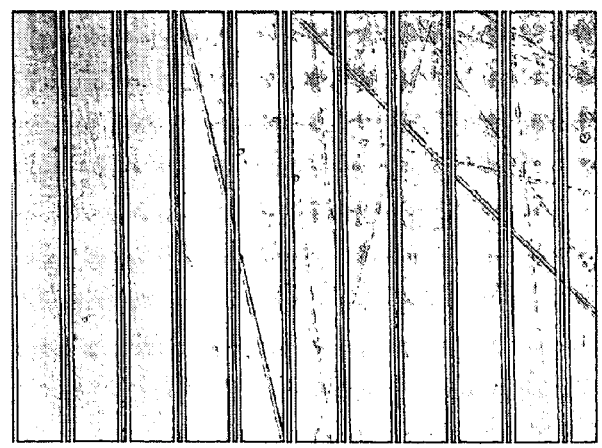
FIG. 15 is a micrograph of the surface of a SiC epitaxial layer according to further embodiments of the invention.

FIG. 14 is a Nomarski micrograph of the surface of an epitaxial layer grown on a hex-etched surface in accordance with embodiments of the invention. FIG. 15 is a Nomarski micrograph of the surface of an epitaxial layer grown on a line-etched surface in accordance with embodiments of the invention.

After forming the first and/or second epitaxial layer, one or more electronic devices, such as bipolar devices, may be fabricated in the first and/or second epitaxial silicon carbide layers using techniques that are well known to those having skill in the art. The fabrication of electronic devices, such as bipolar devices, is well known to those having skill in the art and need not be described further herein. These devices are not illustrated in FIGS. 10–12 for sake of clarity. Moreover, it will be understood that three or more repetitions of the feature forming and epitaxial-growing steps may be performed.

The techniques referred to herein are, taken individually, generally well-recognized and well-understood in the art and can be practiced without undue experimentation. Single crystal silicon carbide wafers of the type that may be used as starting structures herein are commercially available from Cree, Inc. 4600 Silicon Drive, Durham, N.C. 27706. The growth of silicon carbide epitaxial layers can be carried out using techniques such as those set forth in U.S. Pas. Nos. 4,912,063; 4,912,064; 5,679,153; and 6,297,522. Dry and electrolytic etching of silicon carbide are described in U.S. Pat. Nos. 6,034,001; 5,571,374; 5,227,034; 4,981,551; and 4,865,685. The use of molten potassium hydroxide as an etchant to identify and characterize a semiconductor surface is well-understood, and includes versions expressed as ASTM standards (e.g. ASTM F1404.92). Cutting, mechanical polishing and lapping of substrate wafers are also entirely conventional in this art.

In the drawings and specification, there have been disclosed typical embodiments of the invention, and, although specific terms have been employed, they have been used in a generic and descriptive sense only and not for purposes of limitation, the scope of the invention being set forth in the following claims.

The invention claimed is:

1. A method of fabricating an epitaxial silicon carbide layer comprising:
   forming a plurality of features in a surface of a silicon carbide substrate having an off-axis orientation toward a predetermined crystallographic direction, the plurality of features including at least one sidewall that is oriented nonparallel to the predetermined crystallographic direction; and
   growing the epitaxial silicon carbide layer on the surface of the silicon carbide substrate that includes the plurality of features therein, the epitaxial silicon carbide layer being thicker than a depth of the at least one sidewall.

2. A method according to claim 1 wherein forming a plurality of features comprises:
   masking the surface of the silicon carbide substrate having an off-axis orientation toward a predetermined crystallographic direction; and
   etching the surface of the silicon carbide substrate that is exposed by the masking to form the plurality of features in the surface of a silicon carbide substrate that is masked.

3. A method according to claim 2 wherein etching comprises dry etching the surface of the silicon carbide substrate that is masked using $NF_3$ and/or $SF_6$.

4. A method according to claim 1 wherein the predetermined crystallographic direction is a <11$\bar{2}$0> direction.

5. A method according to claim 1 wherein forming a plurality of features comprises forming a plurality of trenches in the surface of the silicon carbide substrate having an off-axis orientation toward a predetermined crystallographic direction, the plurality of trenches extending oblique and/or perpendicular to the predetermined crystallographic direction and including at least one sidewall that is oriented nonparallel to the predetermined crystallographic direction.

6. A method according to claim 1 wherein forming a plurality of features comprises forming a plurality of depressions in the surface of the silicon carbide substrate having an off-axis orientation toward a predetermined crystallographic direction and including at least one sidewall that is oriented nonparallel to the predetermined crystallographic direction.

7. A method according to claim 6 wherein the plurality of depressions comprises a periodically repeating pattern of hexagonal pits.

8. A method according to claim 1 wherein growing the epitaxial silicon carbide layer comprises:
   growing the epitaxial silicon carbide layer on the surface of the silicon carbide substrate that includes the plurality of features therein such that the epitaxial silicon carbide layer contains lower basal plane dislocation density than the silicon carbide substrate.

9. A method according to claim 1 further comprising:
   forming a semiconductor device in the epitaxial silicon carbide layer.

10. A method of fabricating an epitaxial monocrystalline layer comprising:
    forming a plurality of features in a surface of a monocrystalline substrate having an off-axis orientation toward a predetermined crystallographic direction, the plurality of features including at least one sidewall; and
    growing the epitaxial layer on the surface of the monocrystalline substrate that includes the plurality of features therein, the epitaxial layer being thicker than a depth of the at least one sidewall.

11. A method according to claim 10 wherein forming a plurality of features comprises:
    masking the surface of the monocrystalline substrate having an off-axis orientation toward a predetermined crystallographic direction; and
    etching the surface of the monocrystalline substrate that is masked to form the plurality of features in the surface of a monocrystalline substrate that is masked.

12. A method according to claim 10 wherein growing the epitaxial layer comprises:
    growing the epitaxial layer on the surface of the monocrystalline substrate that includes the plurality of features therein such that the epitaxial layer contains lower basal plane dislocation density than the monocrystalline substrate.

13. A method according to claim 10 wherein the monocrystalline substrate comprises silicon carbide.

14. A method of fabricating an epitaxial silicon carbide layer comprising:
    epitaxially growing from at least one sidewall of a periodically repeating pattern of hexagonal pits in a surface of a silicon carbide substrate having an off-axis orientation toward a predetermined crystallographic direction to form the epitaxial silicon carbide layer, the at least one sidewall of the periodically repeating pattern of hexagonal pits being oriented nonparallel to the predetermined crystallographic direction.

15. A method according to claim 14 wherein the predetermined crystallographic direction is a <11$\bar{2}$0> direction.

16. A method according to claim 14 wherein the epitaxial silicon carbide layer contains lower basal plane dislocation density than the silicon carbide substrate.

* * * * *